US008363685B2

(12) United States Patent
Kim et al.

(10) Patent No.: US 8,363,685 B2
(45) Date of Patent: Jan. 29, 2013

(54) WAVELENGTH TUNABLE EXTERNAL CAVITY LASER BEAM GENERATING DEVICE

(75) Inventors: Hyun Soo Kim, Daejeon (KR); Ki-Hong Yoon, Daejeon (KR); Kisoo Kim, Daejeon (KR); Byung-Seok Choi, Daejeon (KR); O-Kyun Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1 day.

(21) Appl. No.: 13/016,238

(22) Filed: Jan. 28, 2011

(65) Prior Publication Data

US 2012/0093178 A1 Apr. 19, 2012

(30) Foreign Application Priority Data

Oct. 14, 2010 (KR) .................. 10-2010-0100401

(51) Int. Cl.
*H01S 3/10* (2006.01)
(52) U.S. Cl. ............... 372/20; 372/50.11; 372/50.22; 372/102
(58) Field of Classification Search ............... 372/20
See application file for complete search history.

(56) References Cited

U.S. PATENT DOCUMENTS

| 5,392,308 | A * | 2/1995 | Welch et al. ............... 372/92 |
| 5,463,647 | A * | 10/1995 | Pan ........................... 372/12 |
| 5,499,261 | A | 3/1996 | Welch et al. |
| 6,295,308 | B1 * | 9/2001 | Zah ........................... 372/50.1 |
| 6,574,259 | B1 * | 6/2003 | Fish et al. .................. 372/50.1 |
| 6,728,290 | B1 * | 4/2004 | Coleman et al. ............ 372/102 |
| 7,215,218 | B2 | 5/2007 | Burns et al. |
| 2001/0036206 | A1 * | 11/2001 | Jerman et al. ............... 372/20 |
| 2003/0086449 | A1 * | 5/2003 | Jacquet et al. .............. 372/25 |
| 2003/0091081 | A1 * | 5/2003 | Sahara et al. ............... 372/45 |
| 2003/0108079 | A1 * | 6/2003 | Song et al. .................. 372/92 |
| 2008/0285603 | A1 | 11/2008 | Mason et al. |

FOREIGN PATENT DOCUMENTS

| JP | 11-177178 A | 7/1999 |
| KR | 10-0519922 | 9/2005 |

OTHER PUBLICATIONS

Ki-Hong Yoon, et al., "2.5-Gb/s hybridly-integrated tunable external cavity laser using a superluminescent diode and a polymer Bragg reflector", Optics Express, vol. 18, No. 6, pp. 5556-5561 (2010).
Berger, J.D., et al., "Widely tunable external cavity diode laser using a MEMS electrostatic rotary actuator", Proc. 27th Eur. Conf. on Opt. Comm. (ECOC'01—Amsterdam), pp. 198-199 (2001).

\* cited by examiner

*Primary Examiner* — Xinning Niu
(74) *Attorney, Agent, or Firm* — Rabin & Berdo, P.C.

(57) ABSTRACT

Provided is a wavelength tunable external cavity laser (laser beam) generating device. The wavelength tunable external cavity laser generating devices includes: an optical amplifier, a comb reflector, and an optical signal processor connected in series on a first substrate; and an external wavelength tunable reflector disposed on a second substrate adjacent to the first substrate and connected to the optical amplifier, wherein the comb reflector includes: a waveguide disposed on the first substrate; a first diffraction grating disposed at one end of the waveguide adjacent to the optical amplifier; and a second diffraction grating disposed at the other end of the waveguide adjacent to the optical signal processor, wherein the optical amplifier, the comb reflector, and the optical signal processor constitute a continuous waveguide.

17 Claims, 7 Drawing Sheets

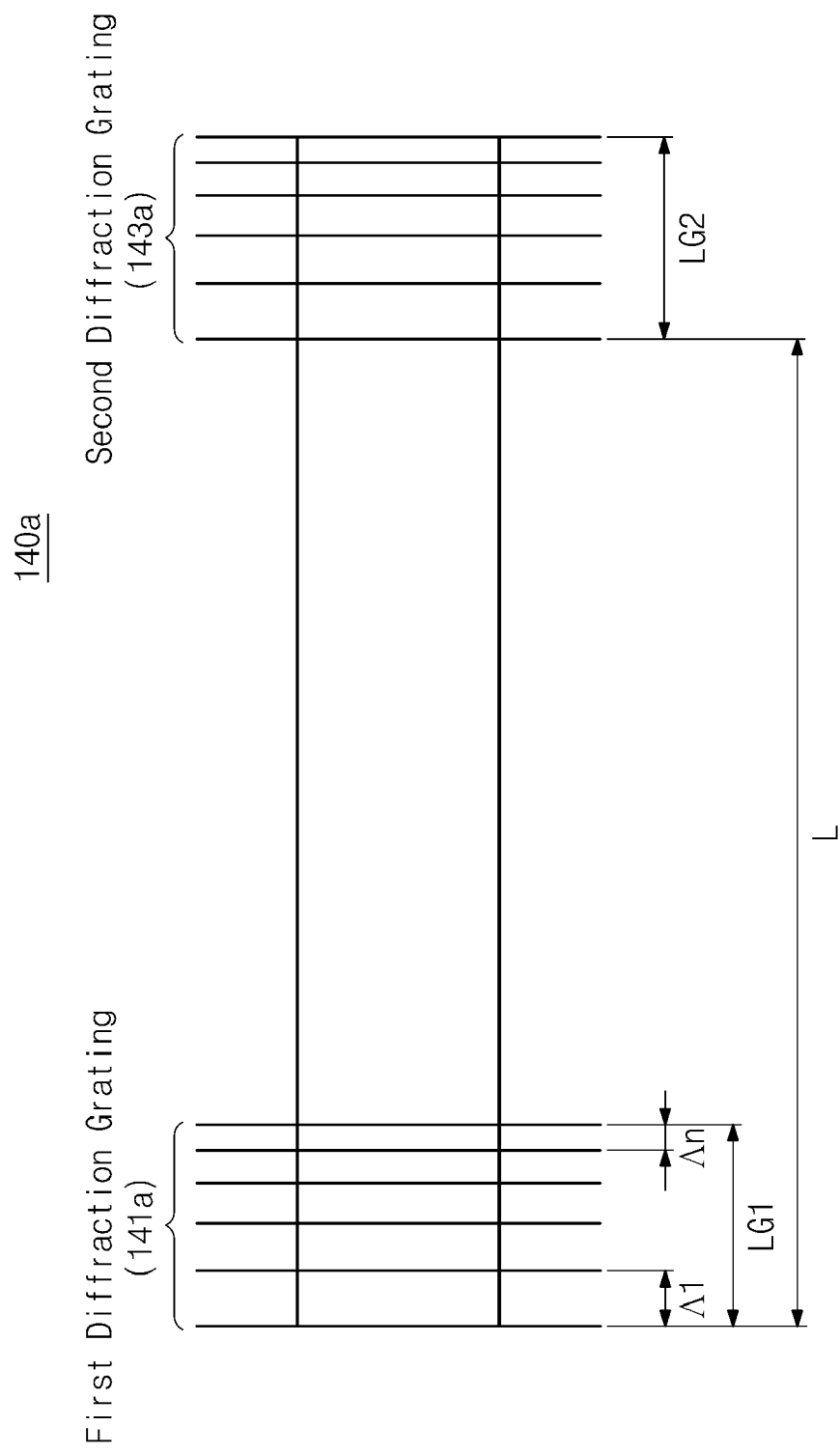

WAVELENGTH TUNABLE EXTERNAL CAVITY LASER BEAM GENERATING DEVICE

CROSS-REFERENCE TO RELATED APPLICATIONS

This U.S. non-provisional patent application claims priority under 35 U.S.C. §119 of Korean Patent Application No. 10-2010-0100401, filed on Oct. 14, 2010, in the Korean Intellectual Property Office (KIPO), the entire contents of which are hereby incorporated by reference.

BACKGROUND OF THE INVENTION

The present invention disclosed herein relates to a laser (laser beam) generating device, and more particularly, to a wavelength tunable external cavity laser generating device.

As society and technology are in advance, the kinds of contents consumed are diversified and their amounts also are increased. The increasing amounts of contents require developments of communication technology used for delivering the contents.

As one of mass communication technologies, optical communication has been researched and developed. The optical communication converts a transmit signal into a light at the transmitter, transmits the converted signal as a light through a medium such as an optical cable, and then converts the received optical signal into an original signal at the receiver.

The typical one of the optical communication technologies is a Wavelength Division Multiplexing Passive Optical Network (WDM-PON). The WDM-PON requires a wavelength tunable laser.

SUMMARY OF THE INVENTION

The present invention provides a wavelength tunable external cavity laser (laser beam) generating device with high-speed modulation.

The present invention also provides a wavelength tunable external cavity laser generating device with the improved degree of integration.

Embodiments of the present invention provide wavelength tunable external cavity laser generating devices including: an optical amplifier, a comb reflector, and an optical signal processor connected in series on a first substrate; and an external wavelength tunable reflector disposed on a second substrate adjacent to the first substrate and connected to the optical amplifier, wherein the comb reflector includes: a waveguide disposed on the first substrate; a first diffraction grating disposed at one end of the waveguide adjacent to the optical amplifier; and a second diffraction grating disposed at the other end of the waveguide adjacent to the optical signal processor, wherein the optical amplifier, the comb reflector, and the optical signal processor constitute a continuous waveguide.

In some embodiments, the optical amplifier, the comb reflector, and the external wavelength tunable reflector may form a Fabry-Perot resonance mode.

In other embodiments, the comb reflector may have reflective bands of a comb shape, each of the reflective bands of the comb shape having a bandwidth corresponding to one of a plurality of reflective bands of the Fabry-Perot resonance mode.

In still other embodiments, the optical amplifier, the comb reflector, and the external wavelength tunable reflector may generate a laser (laser beam) having a wavelength that commonly corresponds to one of a plurality of reflective bands of the Fabry-Perot resonance mode, a reflective band of the external wavelength tunable reflector, and one of reflective bands of the comb reflector.

In even other embodiments, the reflective band of the external wavelength tunable reflector may be tuned according to a control signal provided to the external wavelength tunable reflector.

In yet other embodiments, an interval between the reflective bands of the comb reflector may be changed according to a control signal provided to the comb reflector.

In further embodiments, a wavelength corresponding to the maximum reflectance of the comb reflector may be tuned according to a control signal provided to the comb reflector.

In still further embodiments, the wavelength tunable external cavity laser generating device may further include a phase adjustor provided to at least one of both ends of the optical amplifier.

In even further embodiments, an interval between lines of each of the first and second diffraction gratings may be uniform.

In yet further embodiments, an interval between lines of the first diffraction grating may become reduced as it becomes far from the optical amplifier.

In yet further embodiments, an interval between lines of the second diffraction grating may become increased as it becomes far from the optical signal processor.

In yet further embodiments, the wavelength tunable external cavity laser generating device may further include a size spot converter provided between the optical amplifier and the external wavelength tunable reflector.

In yet further embodiments, the wavelength tunable external cavity laser generating device may further include an anti-reflection coating provided at both ends of the optical amplifier, the comb reflector, and the optical signal processor connected in series.

In yet further embodiment, the optical signal processor may include a Mach-Zehnder interferometric modulator.

In yet further embodiment, the optical signal processor may include an electric field absorption modulator.

In yet further embodiment, the optical signal processor may include a phase modulator.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 10 is a sectional view of a comb reflector according to a second embodiment of the present invention.

DETAILED DESCRIPTION OF PREFERRED EMBODIMENTS

Figure 1:
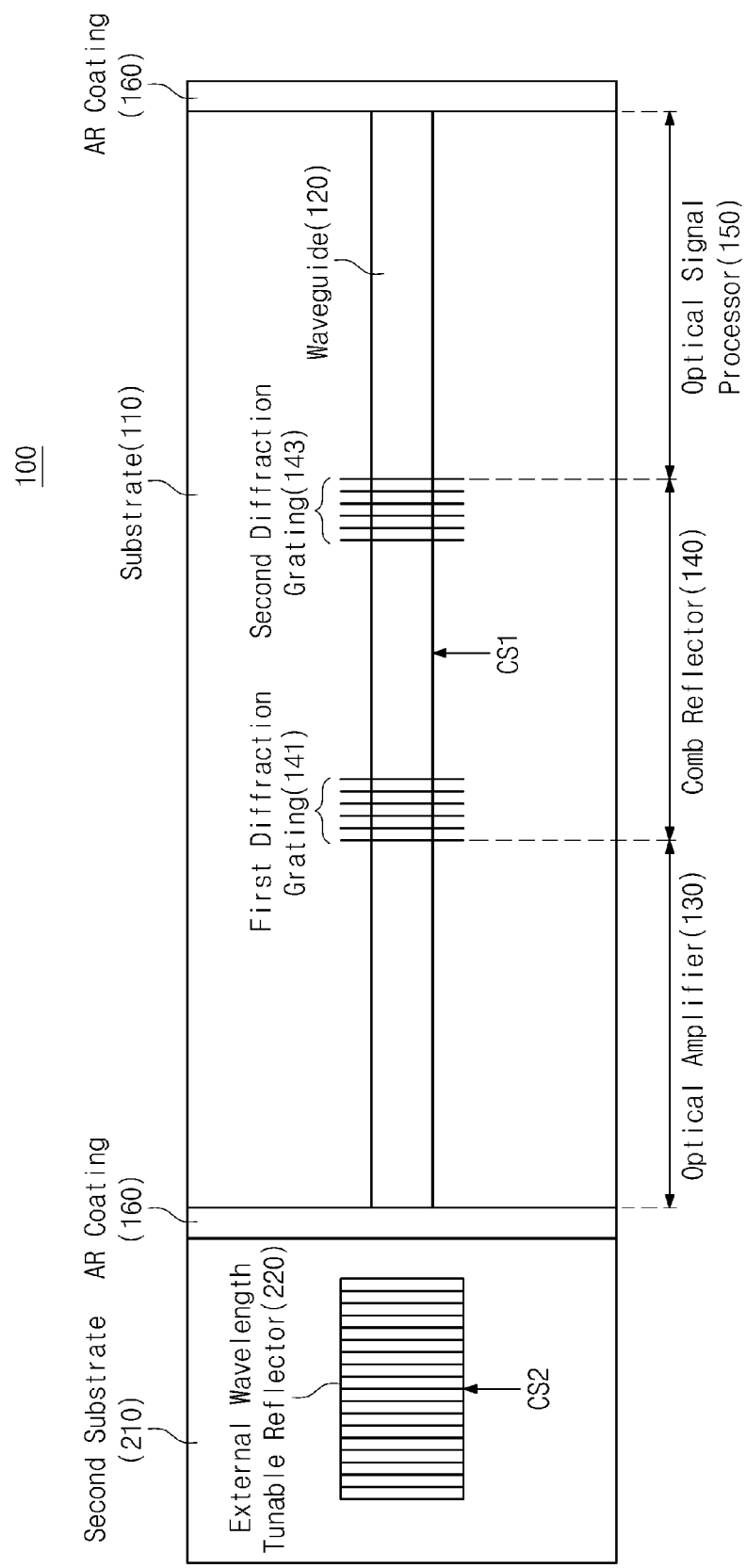
FIG. 1 illustrates a wavelength tunable external cavity laser (laser beam) generating device according to a first embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

FIG. 1 illustrates a wavelength tunable external cavity laser (laser beam) generating device 100 according to a first embodiment of the present invention. Referring to FIG. 1, a first substrate 110 and a second substrate 210 are provided. Exemplarily, the first substrate 110 and the second substrate 210 may be formed of respectively different materials.

A waveguide 120 is provided on the first substrate 110. The waveguide 120 may include an optical amplifier 130, a comb reflector 140, and an optical signal processor 150.

Exemplarily, the waveguide 120 is divided into first to third regions and the first to third regions may correspond to the optical amplifier 130, the comb reflector 140, and the optical signal processor 150, respectively.

As another example, the optical amplifier 130, the comb reflector 140, and the optical signal processor 150 are provided on the first substrate 110 to constitute the continuous waveguide 120.

An external wavelength tunable reflector 220 is provided on the second substrate 210. The external wavelength tunable reflector 220 has a tunable reflective band.

In the wavelength tunable external cavity laser generating device 100, the optical amplifier 130 is provided between the external wavelength tunable reflector 220 and the comb reflector 140. A resonance occurs between the external wavelength tunable reflector 220 and the comb reflector 140. The optical amplifier 130 compensates for optical attenuation occurring during the resonance. Accordingly, a laser (laser beam) is generated through the external wavelength tunable reflector 220, the optical amplifier 130, and the comb reflector 140.

The laser generated through the external wavelength tunable reflector 220, the optical amplifier 130, and the comb reflector 140 is provided to the optical signal processor 150. Exemplarily, the optical signal processor 150 may include an optical modulator. The optical signal processor 150 processes and outputs the laser generated through the external wavelength tunable reflector 220, the optical amplifier 130, and the comb reflector 140.

Exemplarily, an optical cable is provided to an output terminal of the optical signal processor 150 and the output laser of the optical signal processor 150 may be transmitted through the optical cable.

Exemplarily, the optical amplifier 130 may be a ridge or Planar Buried Heterostructure (PBH) gain waveguide. The optical amplifier 130 may include an InGaAsP bulk or an InGaAsP/InGaAsP multiple quantum well having a bandgap of about 1.55 μm.

Exemplarily, the comb reflector 140 may include a first diffraction grating 141 and a second diffraction grating 143. The first diffraction grating 141 may be provided in a region (e.g., directly adjacent) adjacent to the optical amplifier 130 and the second diffraction gird 143 may be provided in a region (e.g., directly adjacent) adjacent to the optical signal processor 150. The first and second diffraction gratings 141 and 143 may be formed through holography or e-beam lithography.

The comb reflector 140 may be a ridge, deep ridge, or PBH passive waveguide. The comb reflector 140 may include an InGaAsP bulk or an InGaAsP/InGaAsP multiple quantum well having a bandgap of about 1.2 μm to about 1.45 μm.

Exemplarily, a first control signal CS1 may be supplied to the comb reflector 140. In response to the first control signal CS1, an effective refractive index $n_{eff}$ of the comb reflector 140 may be changed. For example, an effective refractive index $n_{eff}$ of the comb reflector 140 may be changed according to thermooptic effect or electrooptic effect occurring in response to the first control signal CS1. The first control signal CS1 may be current or voltage.

The optical signal processor 150 may be a ridge, deep ridge, or PBH passive waveguide. The optical signal processor 150 may include a Mach-Zehnder interferometric modulator, an electric field absorption modulator, or a phase modulator. For example, the optical signal processor 150 may include an electric field absorption modulator with an InGaAsP bulk or an InGaAsP/InGaAsP multiple quantum well having a bandgap of a short wavelength of about 40 μm to about 70 μm. As another example, the optical signal processor 150 may include a Mach-Zehnder interferometric modulator with an InGaAsP bulk or an InGaAsP/InGaAsP multiple quantum well having a bandgap of a short wavelength of about 1.2 μm to about 1.4 μm.

The external wavelength tunable reflector 220 may be a diffraction grating (e.g., a polymer grating) having a tunable reflective band, a film type reflector, a Bragg grating reflector, or waveguide type reflector. Exemplarily, a reflective band of the external wavelength tunable reflector 220 may be tuned in response to a second control signal CS2. For example, a reflective band of the external wavelength tunable reflector 220 may be tuned according to thermooptic effect or electrooptic effect occurring in response to the second control signal CS2. The first control signal CS2 may be current or voltage.

An Anti-Reflection (AR) coating 160 may be provided to at least one end of both ends of the optical amplifier 130, the comb reflector 140, and the optical signal processor 150 which constitute the continuous waveguide 120. When the AR coating 160 is provided between the external wavelength tunable reflector 220 and the optical amplifier 130, a loss due to reflection may be reduced in a resonance mode between the external wavelength tunable reflector 220, the optical amplifier 130, and the comb reflector 140. When the AR coating 160 is provided at the output terminal of the optical signal processor 150, a loss due to reflection may be reduced at the output terminal of the wavelength tunable external cavity laser generating device 100.

Exemplarily, when the AR coating 160 is provided at the both ends of the optical amplifier 130, the comb reflector 140, and the optical signal processor 150, which constitute the continuous waveguide 120, Fabry-Perot resonance occurring therein may be suppressed.

Exemplarily, a Spot Size Converter (SSC) (not shown) may be additionally provided between the external wavelength tunable reflector 220 and the optical amplifier 130. Once the SSC is additionally provided, coupling efficiency of the external wavelength tunable reflector 220 and the optical amplifier 130 may be improved.

In the same manner, a SSC (not shown) may be additionally provided at the output terminal of the optical signal processor 150. Once the SSC is additionally provided, coupling efficiency of the optical signal processor 150 and a transmission medium (e.g., an optical fiber) connected to the output terminal of the optical signal processor 150 may be improved.

Figure 2:
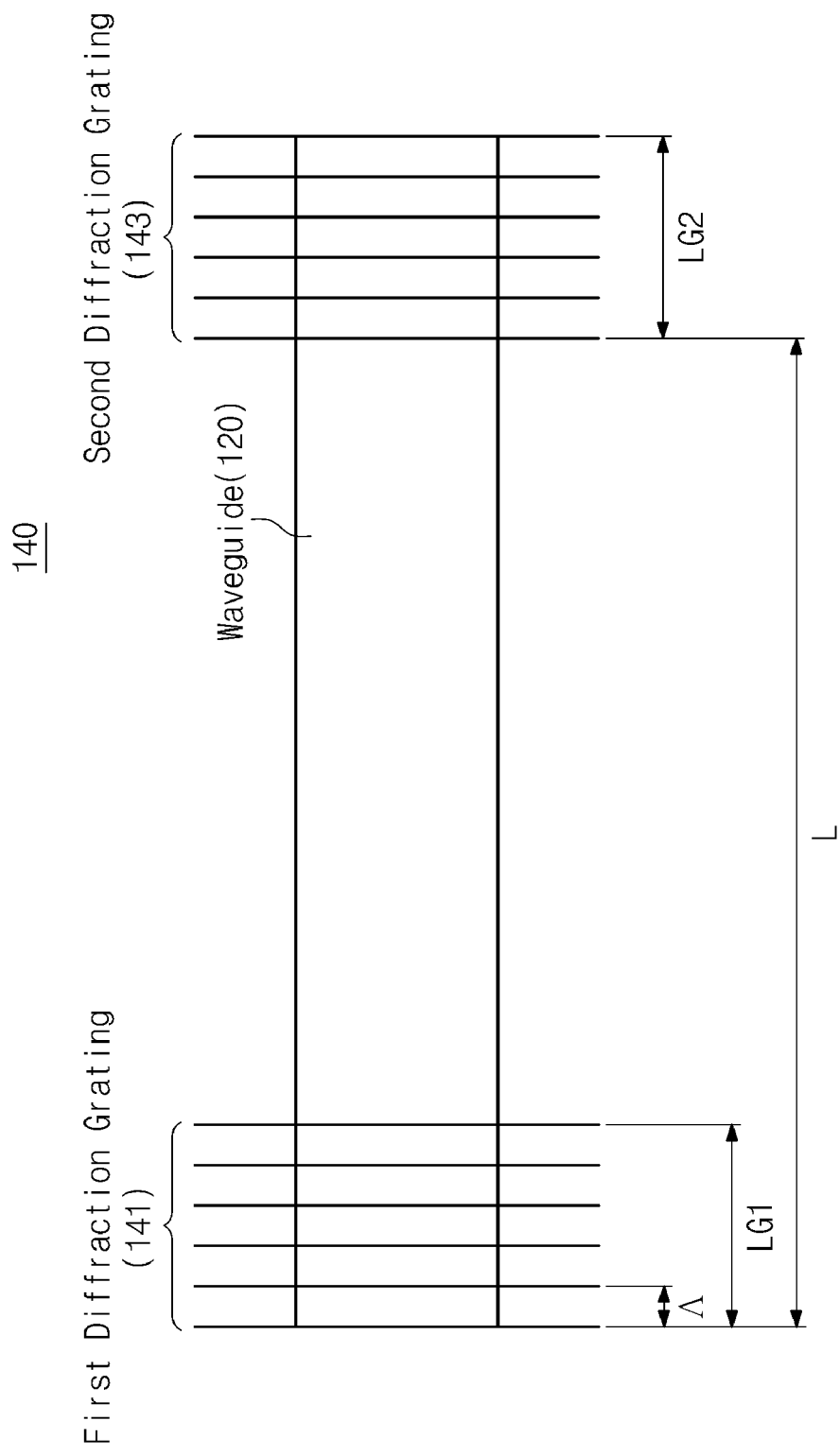
FIG. 2 illustrates a comb reflector according to a first embodiment of the present invention.

FIG. 2 illustrates a comb reflector 140 according to a first embodiment of the present invention. Referring to FIG. 2, a first diffraction grating 141 is provided in a first region of the waveguide 120, more specifically, a region adjacent to the optical amplifier 130 among regions of the waveguide 120 in the comb reflector 140. A second diffraction grating 143 is provided in a second region of the waveguide 120, more specifically, a region adjacent to the optical signal processor 150 among regions of the waveguide 120 in the comb reflector 140.

An interval Λ between lines in each diffraction grating is uniform. The width LG1 of the first diffraction grating 141 and the width LG2 of the second diffraction grating 143 are defined. Moreover, the distance L between the starting portion of the first diffraction grating 141 and the starting portion of the second diffraction grating 143 is defined.

Figure 3:
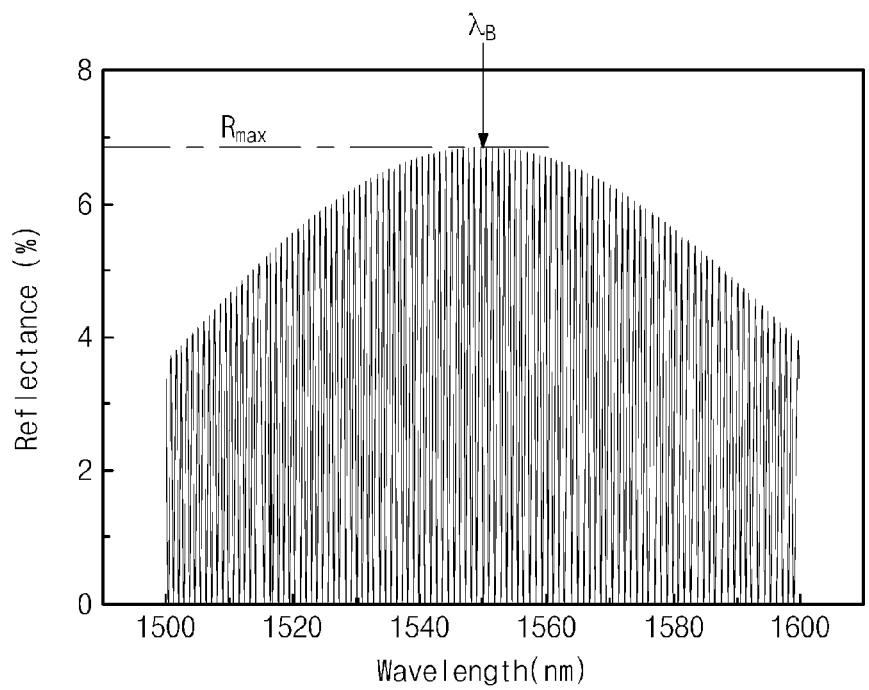
FIG. 3 is a graph illustrating a simulation result about reflective characteristic of the comb reflector shown in FIG. 2.

FIG. 3 is a graph illustrating a simulation result about reflective characteristic of the comb reflector 140 shown in FIG. 2. In FIG. 3, an x-axis represents a wavelength and its unit is nm. A y-axis represents a reflectance and its unit is %.

Referring to FIGS. 2 and 3, an envelope of the reflective characteristic of the comb reflector 140 has a Gaussian form based on a central wavelength $\lambda_B$. In the central wavelength $\lambda_B$, the reflectance of the comb reflector 140 has the maximum reflectance $R_{max}$.

The central wavelength $\lambda_B$ corresponding to the maximum reflectance $R_{max}$ is defined according to a structure of the comb reflector 140 and a characteristic of the waveguide 120. Exemplarily, the central wavelength $\lambda_B$ is expressed as Equation 1.

$$\lambda_B = 2 \times n_{eff} \times \Lambda$$

That is, the central wavelength $\lambda_B$ may be tuned according to the effective refractive index $n_{eff}$ of the waveguide 120 in the comb reflector 140.

Figure 4:
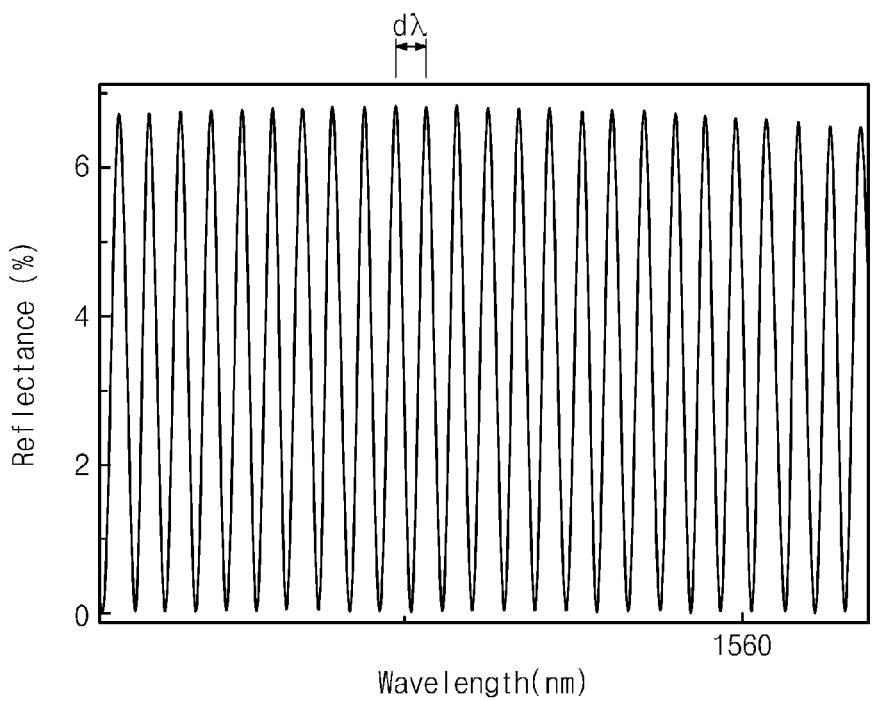
FIG. 4 is an enlarged view of a periphery area of the central wavelength $\lambda_B$ shown in FIG. 3.

FIG. 4 is an enlarged view of a periphery area of the central wavelength $\lambda_B$ shown in FIG. 3. Referring to FIGS. 2 through 4, the comb reflector 140 has comb-shaped reflective bands. The interval dλ between reflective bands is uniform and is expressed as Equation 2

$$d\lambda = \frac{\lambda_B^2}{2|n_{eff}|L} \quad \text{[Equation 2]}$$

That is, the interval dλ between reflective bands of the comb reflector 140 may be adjusted according to the effective refractive index $n_{eff}$ of the waveguide 120 in the comb reflector 140.

Figure 5:
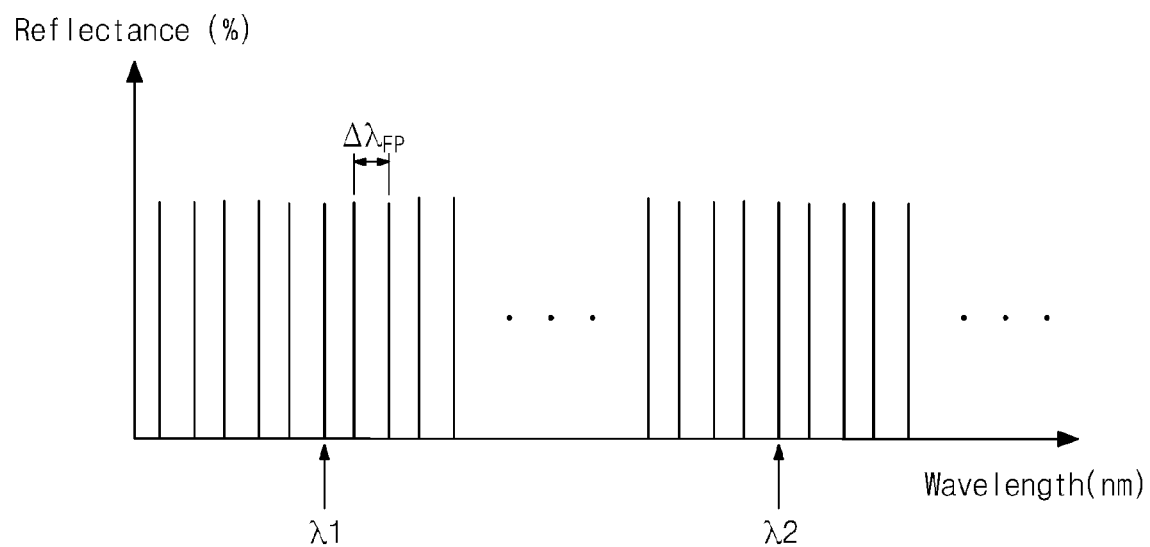
FIG. 5 is a graph illustrating a reflective characteristic of a Fabry-Perot resonance mode in the wavelength tunable external cavity laser generating device.

FIG. 5 is a graph illustrating a reflective characteristic of a Fabry-Perot resonance mode in the wavelength tunable external cavity laser generating device 100 of FIG. 1. The reflective characteristic of a Fabry-Perot resonance mode occurring between the external wavelength tunable reflector 220, the optical amplifier 130, and the comb reflector 140 is shown in FIG. 5. In FIG. 5, an x-axis represents a wavelength and a y-axis represents a reflectance R.

Referring to FIG. 5, a plurality of reflective bands are provided in the Fabry-Perot resonance mode of the wavelength tunable external cavity laser generating device 100. The interval $\Delta\lambda_{FP}$ between the plurality of reflective bands in the Fabry-Perot resonance mode is uniform. As shown in FIG. 5, the plurality of reflective bands in the Fabry-Perot resonance mode are provided in a band having a first wavelength λ1 and a second wavelength λ2.

Figure 6:
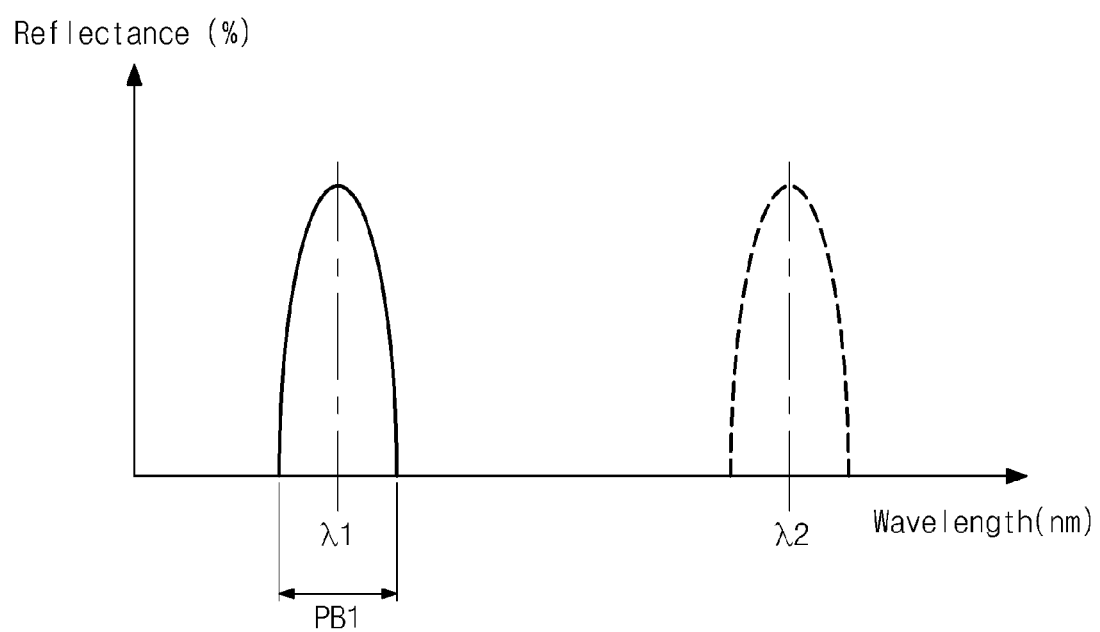
FIG. 6 is a graph illustrating a reflective characteristic of the external wavelength tunable reflector.

FIG. 6 is a graph illustrating a reflective characteristic of the external wavelength tunable reflector 220 of FIG. 1. In FIG. 6, an x-axis represents a wavelength and a y-axis represents a reflectance R.

Referring to FIG. 6, the width PB1 of a reflective band of the external wavelength tunable reflector 220 is defined. In FIG. 6, the reflective band of the external wavelength tunable reflector 220 is provided based on the first wavelength λ1. If the reflective band of the external wavelength tunable reflector 220 is tuned from the first wavelength λ1 into the second wavelength λ2, it may be provided based on the second wavelength λ2.

Figure 7:
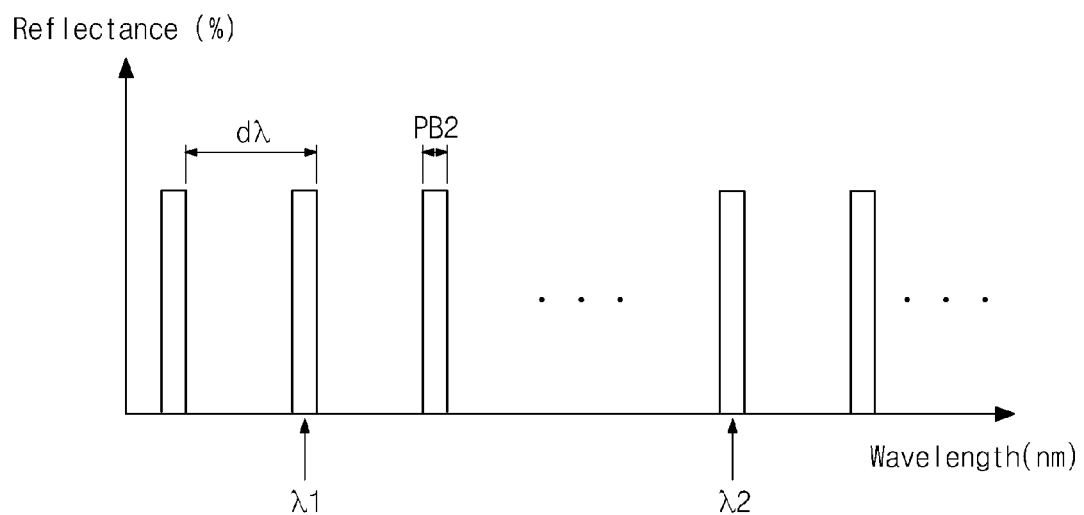
FIG. 7 is a graph illustrating a reflective characteristic of the comb reflector.

FIG. 7 is a graph illustrating a reflective characteristic of the comb reflector 140 of FIG. 1. In FIG. 7, an x-axis represents a wavelength and a y-axis represents a reflectance R.

Referring to FIG. 7, the comb reflector 140 forms a plurality of reflective bands having a comb shape. In FIG. 7, the width PB2 of the reflective band and the interval dλ between the reflective bands in the comb reflector 140 are defined.

Referring to FIGS. 1 and 5 through 7, the optical amplifier 130, the comb reflector 140, and the external wavelength tunable reflector 220 form a Fabry-Perot resonance mode. A reflective characteristic of the Fabry-Perot resonance mode is shown in FIG. 5. In the Fabry-Perot resonance mode, the interval $\Delta\lambda_{FP}$ between the reflective bands is inversely proportional to the distance between the external wavelength tunable reflector 220 and the comb reflector 140. Typically, the interval $\Delta\lambda_{FP}$ between the reflective bands of the Fabry-Perot resonance mode is formed very densely. For example, the interval $\Delta\lambda_{FP}$ between the reflective bands of the Fabry-Perot resonance mode may be about 0.1 nm.

A reflective characteristic of the external wavelength tunable reflector 220 is shown in FIG. 6. Exemplarily, the width PB1 of the reflective band of the external wavelength tunable reflector 220 is formed greater than the interval $\Delta\lambda_{FP}$ between the reflective bands of the Fabry-Perot resonance mode. That is, the reflective band of the external wavelength tunable reflector 220 may include at least two reflective bands of the Fabry-Perot resonance mode. Exemplarily, the Full Width at Half Maximum of the reflective band of the external wavelength tunable reflector 220 is formed with about 0.4 nm to about 2 nm.

The reflective characteristic of the comb reflector 140 is shown in FIG. 7. Exemplarily, the width of each reflective band of the comb reflector 140 is formed to correspond to one of the reflective bands of the Fabry-Perot resonance mode. That is, the width PB2 of each reflective band of the comb reflector 140 is formed not to include at least two reflective bands of the Fabry-Perot resonance mode in one reflective band of the comb reflector 140.

In a resonator consisting of the external wavelength tunable reflector 220, the optical amplifier 130, and the comb reflector 140, a light in a band, which commonly corresponds to one of the reflective bands of the Fabry-Perot resonance mode, a reflective band of the external wavelength tunable reflector 220, and one of the reflective bands of the comb reflector 140, may resonate. That is, a single mode laser, which commonly corresponds to one of the reflective bands of the Fabry-Perot resonance mode, a reflective band of the external wavelength tunable reflector 220, and one of the reflective bands of the comb reflector 140, is generated in the wavelength tunable external cavity laser generating device 100.

Exemplarily, the reflective band of the Fabry-Perot resonance mode corresponding to the first wavelength λ1 is provided as shown in FIGS. 5 through 7. Additionally, the reflective band of the external wavelength tunable reflector 220 is provided based on the first wavelength λ1, and one of the reflective bands of the comb reflector 140 corresponds to the first wavelength λ1. At this point, the wavelength tunable external cavity laser generating device 100 generates a single mode laser corresponding to the first wavelength λ1.

The reflective band of the Fabry-Perot resonance mode corresponding to the second wavelength λ2 is provided as shown in FIGS. 5 through 7. One of the reflective bands of the comb reflector 140 corresponds to the second wavelength λ2. Accordingly, when a reflective band of the external wavelength tunable reflector 220 is tuned to correspond to the second wavelength λ2, the wavelength tunable external cavity laser generating device 100 may generate a single mode laser corresponding to the second wavelength λ2.

Figure 8:
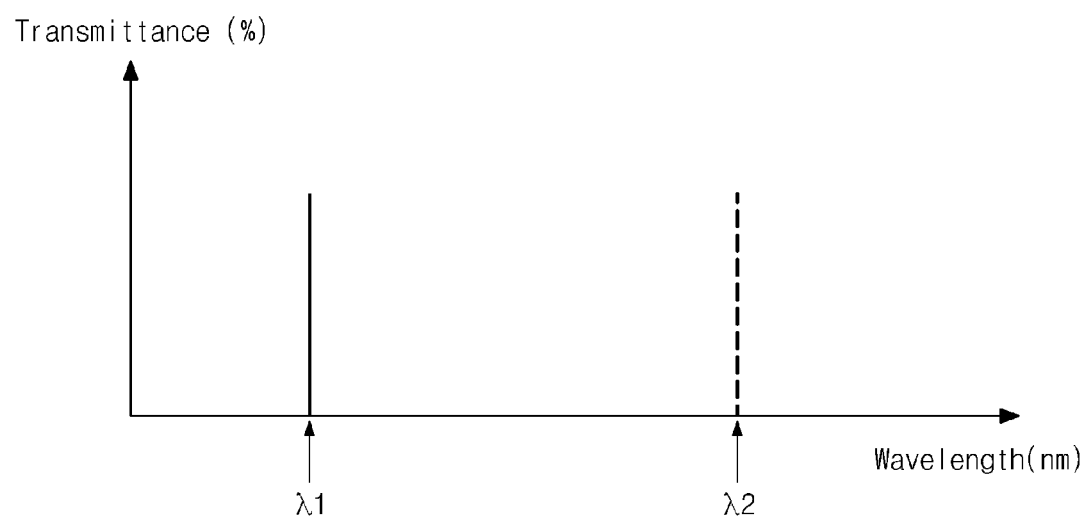
FIG. 8 is a graph illustrating transmission characteristics of the wavelength tunable external cavity laser generating device.

Transmission characteristics of the wavelength tunable external cavity laser generating device 100 according to a change of a reflective band of the external wavelength tunable reflector 220 are shown in FIG. 8. In FIG. 8, an x-axis represents a wavelength and a y-axis represents a transmittance T. Referring to FIG. 8, when a reflective band of the external wavelength tunable reflector 220 corresponds to the first wavelength λ1, the wavelength tunable external cavity laser generating device 100 outputs a single mode laser corresponding to the first wavelength λ1. When a reflective band of the external wavelength tunable reflector 220 is tuned in response to the second wavelength λ2, the wavelength tunable external cavity laser generating device 100 outputs a single mode laser corresponding to the second wavelength λ2.

As mentioned above, the wavelength tunable external cavity laser generating device 100 according to an embodiment of the present invention consists of an optical device integrated in one substrate and a wavelength tunable reflector integrated in one substrate. The optical device integrated in one substrate includes the optical amplifier 130, the comb reflector 140, and the optical signal processor 150. The optical signal processor 150, for example, an optical modulator, is integrated with the optical amplifier 130 and the comb reflector 140 so that they constitute one continuous waveguide 120. Accordingly, a high-speed modulation of a laser outputted through the comb reflector 140 may be performed.

A reflective band of the external wavelength tunable reflector 220 is changed in response to the second control signal CS2. The comb reflector 140 provides selectivity for selecting one of reflective bands of the Fabry-Perot resonance mode corresponding to the reflective ands of the external wavelength tunable reflector 220. Accordingly, a single mode laser of a tunable wavelength may be generated.

An optical device (consisting of the optical amplifier 130, the comb reflector 140, and the optical signal processor 150) and the external wavelength tunable reflector 220 are formed on substrates, respectively. Accordingly, the degree of integration in the wavelength tunable external cavity laser generating device 100 may be improved.

The effective refractive index $n_{eff}$ of the waveguide 120 constituting the comb reflector 140 may be changed in response to the first control signal CS1. As defined in Equation 1, the wavelength $\lambda_B$ corresponding to the maximum reflectance $R_{max}$ of the comb reflector 140 may be controlled according to the effective refractive index $n_{eff}$ of the waveguide 120 constituting the comb reflector 140. That is, according to the first control signal CS1, the wavelength $\lambda_B$ corresponding to the maximum reflectance $R_{max}$ of the comb reflector 140 may be tuned.

When the reflective band of the external wavelength tunable reflector 220 is tuned, the wavelength $\lambda_B$ corresponding to the maximum reflectance $R_{max}$ of the comb reflector 140 may be tuned together. For example, in order to correspond to a tunable reflective band of the external wavelength tunable reflector 220, the wavelength $\lambda_B$ corresponding to the maximum reflectance $R_{max}$ of the comb reflector 140 may be tuned together. Accordingly, resonance characteristics of the wavelength tunable external cavity laser generating device 100 may be improved.

As defined in Equation 2, the interval dλ between the reflective bands in the comb reflector 140 may be adjusted according to the effective refractive index $n_{eff}$ of the waveguide 120 in the comb reflector 140. That is, according to the first control signal CS1, the interval dλ between the reflective bands in the comb reflector 140 may be changed.

When a reflective band of the external wavelength tunable reflector 220 is tuned, the interval dλ between the reflective bands in the comb reflector 140 may be adjusted. For example, the interval dλ between the reflective bands in the comb reflector 140 may be adjusted in order not to include more than two reflective bands of the comb reflector 140 in a tunable reflective band of the external wavelength tunable reflector 220. Accordingly, the wavelength tunable external cavity laser generating device 100 prevents a multi mode laser from being generated.

When a reflective band of the external wavelength tunable reflector 220 is tuned, the interval dλ between the reflective bands in the comb reflector 140 may be adjusted. For example, in order to correspond to the maximum reflectance of a tunable reflective band of the external wavelength tunable reflector 220, the interval dλ between the reflective bands in the comb reflector 140 may be adjusted. Accordingly, resonance characteristics of the wavelength tunable external cavity laser generating device 100 may be improved.

Figure 9:
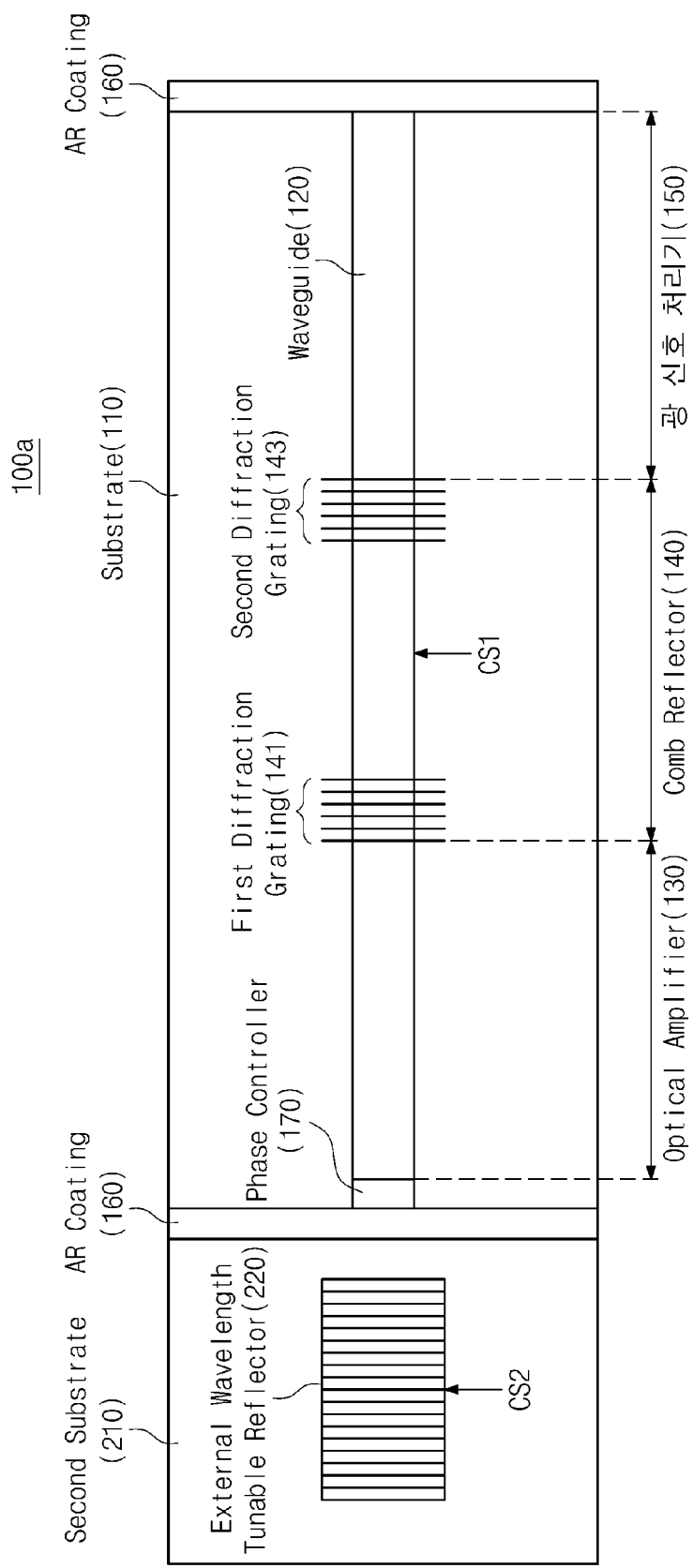
FIG. 9 illustrates a wavelength tunable external cavity laser generating device according to a second embodiment of the present invention.

FIG. 9 illustrates a wavelength tunable external cavity laser generating device 100a according to a second embodiment of the present invention. Compared to the wavelength tunable external cavity laser generating device 100 described with reference to FIG. 1, a phase controller 170 is additionally provided.

The phase controller 170 may adjust Fabry-Perot reflective bands of a resonator consisting of an external wavelength tunable reflector 220, an optical amplifier 130, and a comb reflector 140. That is, once the phase controller 170 is additionally provided, reflective bands of the Fabry-Perot resonance mode are additionally adjusted in addition to the reflective bands of the external wavelength tunable reflector 220 and the comb reflector 140. Accordingly, wavelength tunable characteristics of the wavelength tunable external cavity laser generating device 100a may be improved.

Exemplarily, the phase controller 170 is provided between the external wavelength tunable reflector 220 and the optical amplifier 130 as shown in FIG. 9. However, the phase controller 170 may be provided in a region between the external wavelength tunable reflector 220 and the comb reflector 140.

FIG. 10 is a sectional view of a comb reflector 140a according to a second embodiment of the present invention. Referring to FIG. 10, the com reflector 140a includes a first diffraction grating 141a and a second diffraction grating 143a.

An interval between lines of each diffraction grating sequentially changes from the first interval Λ1 to the nth interval Λn. Exemplarily, an interval between lines of the first diffraction grating 141a becomes reduced as it approaches from the optical amplifier 130 to the optical signal processor 150. An interval between lines of the second diffraction grating 143a becomes reduced as it approaches from the optical amplifier 130 to the optical signal processor 150. That is, the first and second diffraction gratings 141a and 143a of the comb reflector 140a have a chirping structure.

As shown in FIG. 3 and Equation 1, the wavelength $\lambda_B$ corresponding to the maximum reflectance $R_{max}$ of the comb reflector 140 may be turned according to the interval Λ between lines of the diffraction grating. When the first and second diffraction gratings 141a and 143a of the comb reflector 140a have a chirping structure, a reflective characteristic having a uniform reflectance in a broader band than the reflective characteristic shown in FIG. 3 may be obtained based on the wavelength $\lambda_B$ corresponding to the maximum reflectance $R_{max}$.

Exemplarily, as it approaches from a region adjacent to the optical amplifier 130 to a region adjacent to the optical signal processor 150, an interval between lines of the first diffraction grating 141a is sequentially reduced and also an interval between lines of the second diffraction grating 143a is sequentially reduced. That is, the first interval Λ1 is greater than the nth interval Λn. At this point, the comb reflector 140 reflects a light having a relatively long wavelength (i.e., a long wavelength light) among lights corresponding to a plurality of wavelengths, firstly, before a light having a relatively short wavelength (i.e., a short wavelength light). Accordingly, when a light (or laser) is transmitted through an optical fiber, it compensates for a characteristic that a transmission speed of a short wavelength is faster than that of a long wavelength.

Exemplarily, except the interval Λ between lines of each diffraction grating, physical values of the comb reflector 140a are identical to those of the comb reflector 140 described with reference to FIG. 2. Exemplarily, in the comb reflectors 140 and 140a, the width LG1 of the first diffraction grating 141a, the width of the second diffraction grating 143a, and the distance L between the starting portion of the first diffraction grating 141a and the starting portion of the second diffraction grating 143a are identical.

In the above embodiments, it is described that an output laser of the wavelength tunable external cavity laser generating device 100 corresponds to a specific wavelength or a specific band. At this point, the output laser of the wavelength tunable external cavity laser generating device 100 described above is a laser without processing of the optical signal processor 150. Once processing operations of the optical signal processor 150 are applied, a wavelength or a band of the output laser of the wavelength tunable external cavity laser generating device 100 may be tuned.

According to embodiments of the present invention, an optical amplifier, a comb reflector, and an optical modulator are integrated in a continuous waveguide form on a single substrate. Accordingly, a wavelength tunable external cavity laser generating device with high-speed modulation may be provided.

According to embodiments of the present invention, an optical amplifier, a comb reflector, and an optical modulator are integrated in a continuous waveguide form on a single substrate and an external wavelength tunable reflector is provided on the single substrate. Thus, a wavelength tunable external cavity laser generating device with the improved degree of integration may be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A wavelength tunable external cavity laser beam generating device comprising:
    a first substrate;
    a second substrate adjacent to the first substrate;
    an optical amplifier on the first substrate;
    an optical signal processor on the first substrate;
    an external wavelength tunable reflector disposed on the second substrate and connected to the optical amplifier; and
    a comb reflector on the first substrate, wherein the comb reflector includes
        a comb waveguide disposed on the first substrate;
        a first diffraction grating disposed at one end of the comb waveguide adjacent to the optical amplifier; and
        a second diffraction grating disposed at another end of the comb waveguide adjacent to the optical signal processor,
    wherein the optical amplifier, the comb reflector, and the optical signal processor are connected in series in the stated order on the first substrate such that the first diffraction grating and the second diffraction grating are both disposed between the optical amplifier and the optical signal processor, and
    wherein the optical amplifier, the comb reflector and the optical signal processor constitute a continuous waveguide.

2. The wavelength tunable external cavity laser beam generating device of claim 1, wherein the optical amplifier, the comb reflector, and the external wavelength tunable reflector form a Fabry-Perot resonance mode.

3. The wavelength tunable external cavity laser beam generating device of claim 2, wherein the comb reflector forms reflective bands that have a comb shape, each of the reflective bands that form the comb shape having a bandwidth corresponding to only one of a plurality of reflective bands of the Fabry-Perot resonance mode.

4. The wavelength tunable external cavity laser beam generating device of claim 3, wherein the optical amplifier, the comb reflector, and the external wavelength tunable reflector generate a laser beam having a wavelength that commonly corresponds to each of the following:
    one of the plurality of reflective bands of the Fabry-Perot resonance mode,
    a reflective band of the external wavelength tunable reflector, and
    one of the reflective bands of the comb reflector.

5. The wavelength tunable external cavity laser beam generating device of claim 4, wherein the reflective band of the external wavelength tunable reflector is tuned according to a control signal provided to the external wavelength tunable reflector.

6. The wavelength tunable external cavity laser beam generating device of claim 4, wherein an interval between the reflective bands of the comb reflector is changed according to a control signal provided to the comb reflector.

7. The wavelength tunable external cavity laser beam generating device of claim 4, wherein a wavelength corresponding to the maximum reflectance of the comb reflector is tuned according to a control signal provided to the comb reflector.

8. The wavelength tunable external cavity laser beam generating device of claim 4, further comprising a phase adjustor provided to at least one of the ends of the optical amplifier.

9. The wavelength tunable external cavity laser beam generating device of claim 1, wherein intervals between all lines of each of the first and second diffraction gratings are uniform.

10. The wavelength tunable external cavity laser beam generating device of claim 1, wherein intervals between lines of the first diffraction grating become smaller as positions of the intervals increase in distance from the optical amplifier.

11. The wavelength tunable external cavity laser beam generating device of claim 1, wherein intervals between lines of the second diffraction grating become greater as positions of the intervals increase in distance from the optical signal processor.

12. The wavelength tunable external cavity laser beam generating device of claim 1, further comprising a spot size converter provided between the optical amplifier and the external wavelength tunable reflector.

13. The wavelength tunable external cavity laser beam generating device of claim 1, further comprising:
 a first anti-reflection coating provided at an end of the optical amplifier that is further away from the comb reflector than another end thereof; and
 a second anti-reflection coating provided at an end of the optical signal processor that is further away from the comb reflector than another end thereof.

14. The wavelength tunable external cavity laser beam generating device of 1, wherein the optical signal processor comprises a Mach-Zehnder interferometric modulator.

15. The wavelength tunable external cavity laser beam generating device of claim 1, wherein the optical signal processor comprises an electric field absorption modulator.

16. The wavelength tunable external cavity laser beam generating device of claim 1, wherein the optical signal processor comprises a phase modulator.

17. The wavelength tunable external cavity laser beam generating device of claim 2, further comprising:
 a first anti-reflection film touching the optical amplifier and disposed between the optical amplifier and the external wavelength tunable reflector;
 a second anti-reflection film touching the optical signal processor; and
 an optical cable provided at an output of the optical signal processor, the second anti-reflection film disposed between the optical signal processor and the optical cable.

* * * * *